US008890736B2

(12) United States Patent
Chiu et al.

(10) Patent No.: US 8,890,736 B2
(45) Date of Patent: Nov. 18, 2014

(54) SIGNAL MIXING CIRCUIT AND ASSOCIATED CONVERTER

(71) Applicant: MEDIATEK Inc., Hsin-Chu (TW)

(72) Inventors: Wei-Hao Chiu, Taichung (TW); Ang-Sheng Lin, Kaohsiung (TW)

(73) Assignee: MEDIATEK Inc., Hsin-Chu (TW)

( * ) Notice: Subject to any disclaimer, the term of this patent is extended or adjusted under 35 U.S.C. 154(b) by 0 days.

(21) Appl. No.: 13/802,948

(22) Filed: Mar. 14, 2013

(65) Prior Publication Data
US 2014/0070973 A1 Mar. 13, 2014

Related U.S. Application Data

(60) Provisional application No. 61/699,449, filed on Sep. 11, 2012, provisional application No. 61/699,454, filed on Sep. 11, 2012.

(51) Int. Cl.
*H03M 1/66* (2006.01)
*H03D 7/14* (2006.01)

(52) U.S. Cl.
CPC .................................. *H03D 7/1491* (2013.01)
USPC ......................................... 341/144; 341/140

(58) Field of Classification Search
CPC ... H03D 7/1466; H03D 7/1491; H03D 7/166; H03M 1/685; H03M 327/355
USPC .................................... 341/144, 140; 375/295
See application file for complete search history.

(56) References Cited

U.S. PATENT DOCUMENTS

| | | | | |
|---|---|---|---|---|
| 6,501,409 B1 * | 12/2002 | Lynn et al. | ..................... | 341/150 |
| 7,688,130 B2 * | 3/2010 | Li et al. | ......................... | 327/359 |
| 7,772,913 B2 * | 8/2010 | Ikeda | ............................. | 327/355 |
| 7,792,513 B2 * | 9/2010 | Safarian et al. | ............... | 455/296 |
| 8,111,182 B2 * | 2/2012 | Kuttner | ......................... | 341/144 |
| 8,121,577 B1 * | 2/2012 | McKay | ......................... | 455/326 |
| 8,604,958 B2 * | 12/2013 | Pfann et al. | ................... | 341/144 |
| 8,610,616 B2 * | 12/2013 | Baghini et al. | ................. | 341/172 |
| 2004/0137871 A1 * | 7/2004 | McNamara et al. | .......... | 455/326 |

OTHER PUBLICATIONS

He, et al.: "A Low-Power, Low-EVM, SAW-Less WCDMA Transmitter Using Direct Quadrature Voltage Modulation"; IEEE Journal of Solid-State Circuits, vol. 44, No. 12, Dec. 2009; pp. 3448-3458.
Shahriar, et al.: "Design of a Double Balanced Square Law CMOS Up-Conversion Mixer With Improved Input Isolation Technique for High Frequency Applications"; Department of Electrical & Electronic Engineering, Bangladesh University of Engineering & Technology; © 2010 IEEE; pp. 1088-1091.

* cited by examiner

*Primary Examiner* — Peguy Jean Pierre
(74) *Attorney, Agent, or Firm* — McClure, Qualey & Rodack, LLP

(57) ABSTRACT

A signal mixing circuit which mixes input signal(s) and oscillation signal(s) by mixer block(s) to provide a mixed signal. Each mixer block includes a summing node and a circuit unit; the summing node is arranged to provide a sum signal by summing an input signal and an oscillation signal, and the circuit unit is arranged to alternate between a first state and a second state in response to alternating of the oscillation signal; wherein the circuit unit is arranged to provide driving contribution to the mixed signal in response to the sum signal during the first state, and to stop providing driving contribution during the second state. An associated converter, e.g., a digital-to-analog converter, is also disclosed.

16 Claims, 6 Drawing Sheets

SIGNAL MIXING CIRCUIT AND ASSOCIATED CONVERTER

This application claims the benefits of U.S. provisional applications Ser. No. 61/699,449 and 61/699,454, both filed Sep. 11, 2012, the subject matters of which are incorporated herein by reference.

FIELD OF THE INVENTION

The present invention relates to a signal mixing circuit and associated converter, and more particularly, to a signal mixing circuit and associated digital-to-analog converter of low power consumption.

BACKGROUND OF THE INVENTION

Wired and wireless networks, such as mobile telecommunication networks, local area networks, positioning systems, broadcasting systems, sensor (e.g., biomedical sensor) networks and other networks using ISM (industrial, scientific and medical) radio bands, have become essential for modern daily life. In a network, when a transmitter needs to send digital information to a receiver, the transmitter encodes the digital information to a digital base-band (BB) signal, converts the digital base-band signal to an analog base-band signal, modulates (up-converts) the analog base-band signal to a radio-frequency (RF) signal by mixing the analog base-band signal with a local oscillation (LO) signal generated by the transmitter, and performs power amplification to amplify the RF signal, such that the RF signal can be transmitted via network medium (e.g., air for wireless network). When the receiver receives the RF signal, it amplifies the received RF signal, demodulates (down-converts) the RF signal to a demodulated signal by mixing the RF signal with a local oscillation signal generated by the receiver, such that the digital information can be retrieved from the demodulated signal.

From aforementioned operation of network, it is understood that signal mixing and amplifying are of key importance. For the transmitter, a large amount of power is consumed for power amplification and signal mixing. Besides power amplification which consumes the most power, signal mixing consumes less but comparable power, since prior art signal mixing is implemented by Gilbert mixers which include many active components (e.g., transistors) to dissipate currents, especially DC (direct-current) currents. As more networks have to operate under limited power (e.g., power supplied by battery), demands for low-power and low-supply (e.g., low supply voltage) emerge.

For a low-power transmitter, replacing active components by passive ones saves power. Thus, a prior art employs a passive mixer implemented by a switch transistor having a gate, a drain and a source respectively coupled to the LO signal, a digital-to-analog converter (DAC) and a power amplifier (PA); as the switch transistor turns on and off in response to alternating of the LO signal, the analog BB signal provided by the DAC is mixed with the LO signal and sent to the PA for power amplification. However, because the DAC has to drive input of the PA at frequency of the LO signal, the DAC needs to be implemented by current sources which drain a large amount of DC current. Hence, power saving effect of such prior art is quite limited.

SUMMARY OF THE INVENTION

An objective of the invention is providing a signal mixing circuit including a mixer module in cooperation with one or more converters (e.g., DACs). The mixer module is arranged to receive a first number (one or more) of input signals (e.g., base-band signals) and a second number (one or more) of oscillation signals (e.g., LO signals), and to provide a mixed signal in response. The mixer module includes a third number (one or more) of mixer blocks, each mixer block is coupled to an associated input signal and an associated oscillation signal, and includes a summing node and a circuit unit; the summing node is arranged to provide a sum signal by summing the associated input signal and the associated oscillation signal, and the circuit unit is arranged to alternate (switch) between a first state and a second state in response to alternating of the associated oscillation signal, wherein the circuit unit is arranged to provide driving contribution to the mixed signal in response to the sum signal during the first state, and to stop providing driving contribution during the second state.

In an embodiment of the mixer block, the summing node sums the associated oscillation signal and input signal by arranging the associated input signal to ride on the associated oscillation signal. In an embodiment, the mixer block further includes a capacitor and a resistor; the capacitor is coupled between the associated oscillation signal and the summing node for AC (alternating-current) coupling, and the resistor is coupled between the associated input signal and the summing node for suppressing AC coupling from the associated oscillation signal to the associated input signal.

In an embodiment, the mixer module further includes a load, e.g., a passive load such as a inductor, and the load is coupled to two mixer blocks of the mixer module; one of the two mixer blocks is coupled to a first input signal and a first oscillation signal, and the other mixer block is coupled to a second input signal and a second oscillation signal. In an embodiment, the first input signal and the second input signal are differential, the first oscillation signal and the second oscillation signal are differential.

In an embodiment, the mixer module further includes two loads: a first load is coupled to first four mixer blocks, and a second load is coupled to second four mixer blocks, such that the mixed signal is built between the two loads. The first four mixer blocks are respectively coupled to a positive in-phase input signal and a positive in-phase oscillation signal, a negative in-phase input signal and a negative in-phase oscillation signal, a positive quadrature-phase input signal and a positive quadrature-phase oscillation signal, a negative quadrature-phase input signal and a negative quadrature-phase oscillation signal. The second four mixer blocks are respectively coupled to the negative in-phase input signal and the positive in-phase oscillation signal, the positive in-phase input signal and the negative in-phase oscillation signal, the negative quadrature-phase input signal and the positive quadrature-phase oscillation signal, the positive quadrature-phase input signal and the negative quadrature-phase oscillation signal. The positive and negative in-phase/quadrature-phase input/oscillation signals are differential. The positive/negative in-phase and quadrature-phase oscillation signals differ in phase by 90 degrees.

In an embodiment, each circuit unit is coupled to an associated load, and includes a transistor which has a gate and a drain respectively coupled to the summing node and the associated load; the circuit unit alternates between the first state and the second state in response to whether the sum signal is greater than a cut-off level, e.g., a threshold voltage of the transistor. The transistor can function as a trans-conductance cell for power amplification. Thus, functions of power amplifying and signal mixing can be combined.

To cooperate with the mixer blocks, each converter is arranged to provide an associated input signal to one or more associated mixer blocks in response to an associated digital input, and includes a code block and a plurality of converter capacitors. The code block is arranged to receive the associated digital input and to provide a plurality control bits in response. The converter capacitors are commonly coupled to the summing node of the associated mixer block for selectively changing charges of the summing node in response to the associated digital input. For example, each converter capacitor can selectively change charges of the summing node in response to one of control bits.

In an embodiment of the converter, each converter further includes a plurality of converter switches, each converter switch is arranged to selectively conduct one of the converter capacitors to a predetermined level for sharing charges of the summing node in response to the associated digital input, e.g., one of the control bits.

In an alternative embodiment of the converter, each converter further includes a plurality of converter buffers, each converter buffer is arranged to selectively provide charges to one of the converter capacitors in response to the associated digital input, e.g., one of the control bits.

In an embodiment of the mixer module, each oscillation signal is arranged to carry a PM (phase-modulation) information, each input signals is arranged to carry an AM (amplitude-modulation) information, and thus the mixed signal is an AM-PM-merged signal.

In an alternative embodiment of the signal mixing circuit, it includes a mixer module, converter(s) and trans-conductance cell(s). The mixer module includes mixer block(s) and load(s); each mixer block includes a summing node and a circuit unit. The summing node is arranged to sum an input signal and an oscillation signal, and accordingly provides a sum signal. The circuit unit is arranged to alternate between a first state and a second state, and includes a follower and a mixing switch. The follower (e.g., a source follower) includes a bias terminal, a follower-input terminal and a follower-output terminal; the bias terminal and the follower-input terminal are respectively coupled to the oscillation signal and the summing node. The mixing switch is coupled between the follower-output terminal and a predetermined level for conducting the follower-output terminal to the predetermined level during the second state, and ceasing conduction during the first state, such that the circuit unit can provide driving contribution to a mixed signal during the first state, and stop providing driving contribution during the second state An objective of the invention is providing a converter, e.g., a DAC, to cooperate with the mixer block.

An objective of the invention is providing a signal mixing circuit includes one or more mixer blocks, each mixer block is arranged to provide a mixed signal by mixing an input signals and an oscillation signals, and includes a summing node, a transistor, a resistor and a capacitor. The summing node is arranged to sum the input signal and the oscillation signal. The transistor has a gate coupled to the summing node and a drain for outputting the mixed signal. The resistor is coupled between the input signal and the summing node, and the capacitor is coupled between the oscillation signal and the summing node.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 1:
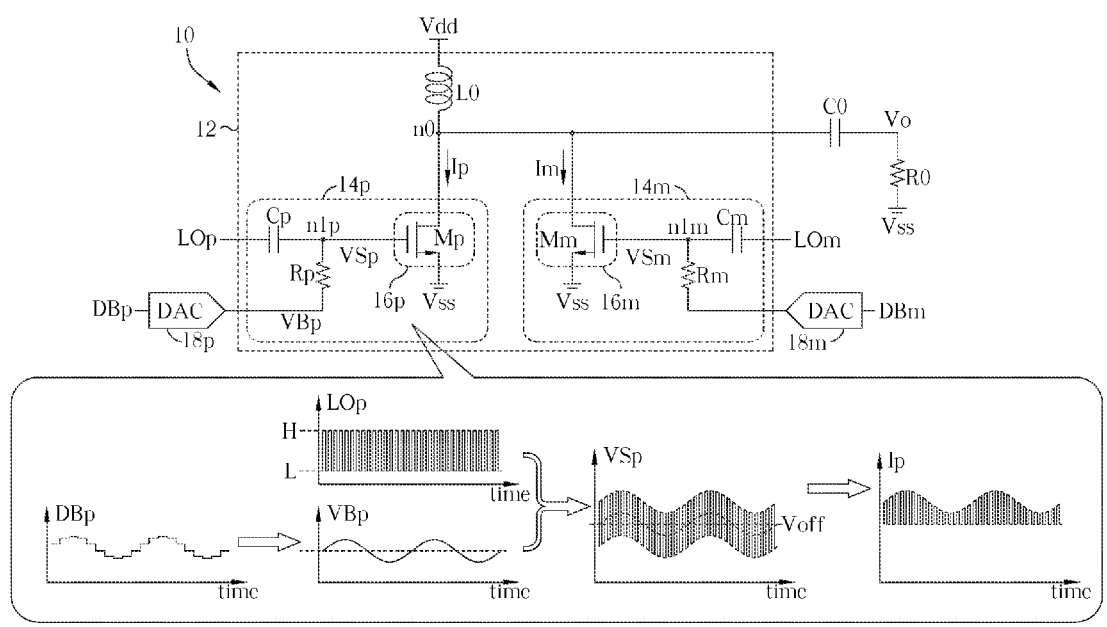
FIG. 1 illustrates a signal mixing circuit according to an embodiment of the invention.

Please refer to FIG. 1 illustrating a signal mixing circuit 10 according to an embodiment of the invention. For example, the signal mixing circuit 10 can be utilized to implement a transmitter of DCT (direct conversion transmitter) architecture, so a pair of signals DBp and DBm (e.g., a pair of differential digital inputs) can be respectively converted to analog signals VBp and VBm, mixed with two signals LOp and LOm for up-conversion, and amplified by power amplification to be transmitted. The signals VBp and VBm can be differential, and the signals LOp and LOm can be differential, i.e., differ in phase by 180 degrees; the signal LOm alternates to the level H when the signal LOp alternates to the level L, and alternates to the level L when the signal LOp alternates to the level H. As demonstrated by the waveforms shown in FIG. 1, the signal DBp (as well as DBm) can be a slow-varying digital base-band input stream which is converted to low-frequency signal VBp, and the signal LOp (as well as LOm) can be a relatively fast-varying, high-frequency pulse train which periodically alternates between two levels H and L.

The signal mixing circuit 10 operates between two supply voltages Vdd and Vss, and includes a mixer module 12 and two converters 18p and 18m. The converters 18p and 18m are arranged to perform digital-to-analog conversion, such that the signals VBp and VBm are provided respectively in response to the signals DBp and DBm. The mixer module 12 receives the signals VBp and VBm as input signals, also receives the signals LOp and LOm which can be oscillation signals generated by local oscillator (not shown). By respectively mixing the signals VBp and VBm with the signals LOp and LOm, the mixer module 12 provides a signal Vo as a mixed signal. The mixer module 12 includes two mixer blocks 14p and 14m, the mixer block 14p is coupled to the signals VBp, LOp and a node n0, and the mixer block 14m is coupled to the signals VBm, LOm and the node n0. The mixer module 12 also includes an inductor L0 as a passive load, which is coupled between the supply voltage Vdd and a node n0.

Functional structures of the mixer blocks 14p and 14m are identical. Taking the mixer block 14p as an illustrative example, the mixer block 14p includes a capacitor Cp, a resistor Rp and a circuit unit 16p coupled to a node n1p which functions as a summing node. As the signal VBp is a relatively low-frequency signal comparing to the high-frequency oscillation signal LOp, the capacitor Cp coupled between the signal LOp and the node n1p is arranged to relay the signal LOp to the node n1p by AC coupling, and the resistor Rp coupled between the signal VBp and the node n1p is arranged to relay the signal VBp to the node n1p and suppress AC coupling from the signal LOp to the signal VBp. Hence, the slow-varying signal VBp can provide a bias of nearly DC (direct-current) nature to the node n1p for bootstrapping the relatively fast-varying signal LOp at the node n1p. That is, the node n1p sums the signals VBp and LOp to provide a signal VSp by arranging the signal VBp to ride on the signal LOp. Equivalently, the resistor Rp contributes a low-pass nature allowing pass of the low-frequency signal DBp, and the capacitor Cp presents a high-pass property allowing pass of the high-frequency signal LOp.

With the signal VSp as a sum signal, the circuit unit 16p is arranged to alternate between a first state and a second state in response to alternating of the signal LOp; during the first state, the circuit unit 16p conducts a current Ip which provides driving contribution to the signal Vo in response to the signal VSp; during the second state, the circuit unit 16p stops providing driving contribution to the signal Vo by ceasing conduction of the current Ip. In the embodiment of FIG. 1, the circuit unit 16p includes a transistor Mp, e.g., an n-channel MOS (metal-oxide-semiconductor) transistor which has a gate, a drain and a source respectively coupled to the nodes n1p, n0 and the supply voltage Vss. Therefore, the circuit unit 16p alternates between the first state and the second state in response to whether the signal VSp is greater than a cut-off level Voff, e.g., a threshold voltage of the transistor Mp. Accordingly, signal mixing can be achieved. In cooperation with the inductor L0, the transistor Mp also functions as a trans-conductance cell of a power amplifier, such that the voltage signal VSp is transferred to the current Ip for power amplification.

As shown by the waveform of the signal VSp (FIG. 1), the mixer block 14p can be so arranged that the signal VBp is lifted above the level Voff by the signal LOp when the signal LOp alternates to the level H, and the signal VBp is lowered below the level Voff by the signal LOp when the signal LOp alternates to the level L. Accordingly, the circuit unit 16p drives the current Ip in response to the lifted sections of the signal VBp, and truncates the lowered sections of the signal VBp with the current Ip left not driven. Therefore, the waveform of the current Ip carries half of signal mixing result formed by the lifted sections of the signal VBp.

During the lowered sections of the signal VBp, the circuit unit 16m complementarily drives a current Im in response to sections of the signal VBm lifted by the signal LOm. Similar to the mixer block 14p, the mixer block 14m includes a capacitor Cm, a resistor Rm and a circuit unit 16m which includes a transistor Mm and reacts to a signal VSm summing the signals LOm and VBm at a node n1m. Therefore, the current Ip carries complementary half of signal mixing result formed by the lifted sections of the signal VBm. As the currents Ip and Im combine at the node n0 to build the signal Vo on a resistor R0 via a capacitor C0, the signal Vo will oscillate at frequency of the signal LOp with swings confined by an envelope formed by the signal VBp. That is, the signal Vo reflects result of mixing the signal VBp with the signal LOp, i.e., translating frequency band of the signal VBp to frequency band of the signal LOp. The resistor R0 can be an equivalent impedance of an antenna, e.g., a resistor of 50 ohms.

Because the mixer block 14p (and 14m) serves as a power amplifier in cooperation with signal mixing implemented by signal summing and truncation, no additional active elements (e.g., transistors) are needed for signal mixing, and power consumption is therefore reduced. Furthermore, the peripheral converters 18p and 18m can be implemented by low-power design. Taking the converter 18p as an illustrative example, because the signal VBp provided by the converter 18p is a low-frequency signal, the gate of the transistor Mp presents high impedance interfacing the converters 18p, and hence the converter 18p can build the signal VBp with only minor driving strength. Since the converter 18p does not require strong driving strength, it does not need to be implemented by power-consuming current sources.

Figure 2:
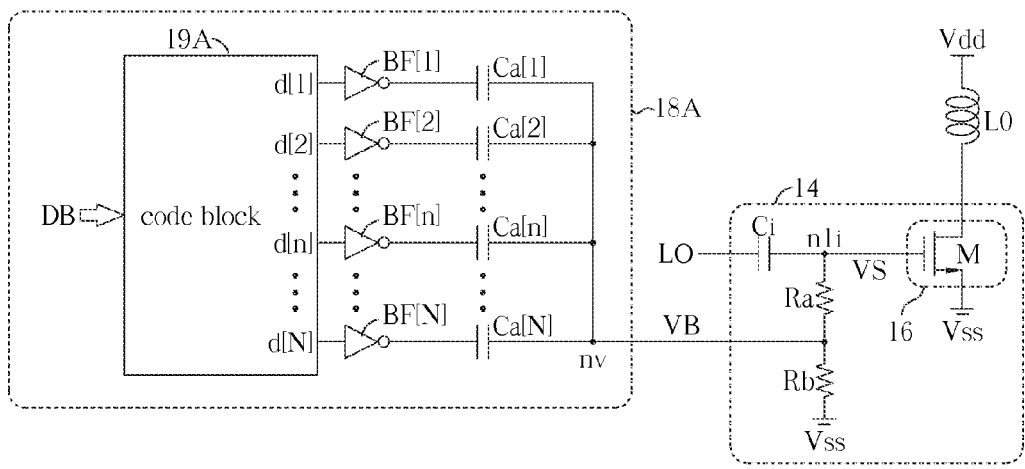
FIG. 2 and FIG. 3 respectively illustrate converters according to embodiments of the invention.

Please refer to FIG. 2 illustrating a converter 18A according to an embodiment of the invention. The converter 18A, e.g., a DAC, is designed to cooperate with a mixer block 14 of the invention, wherein the mixer block 14 can be a portion of a complete mixer module which is not entirely shown in FIG. 2 (and following FIG. 3) for convenience of illustration. For example, the mixer block 14 can be the mixer block 14p or 14m shown in FIG. 1, and the converter 18A can be adopted to implement the converters 18p and 18m. The converter 18A converts a digital input DB (e.g., the signal DBp or DBm) to an analog signal VB (e.g., the signal VBp or VBm) which is inputted to the mixer block 14 via a node nv. Similar to the mixer blocks 14p and 14m, the mixer block 14 includes a capacitor Ci for relaying a high-frequency signal LO to a node n1i by AC coupling, two resistors Ra and Rb for relaying the low-frequency signal VB to the node n1i by low-pass, and a circuit unit 16 implemented by a transistor M for power amplification and signal mixing in response to a sum signal VS which sums the signals LO and VB at the summing node n1i.

The converter 18A includes a code block 19A, a plurality of buffers B[1] to B[N] as converter buffers, and a plurality of capacitors Ca[1] to Ca[N] as converter capacitors. The code block 19A receives the digital input DB and provides a plurality control bits d[1] to d[N] in response. For example, the code block 19A is arranged to decode each digitized signal value streamed in the digital input DB to an associated thermometer code, and binary bits of the thermometer code are provided as the bits d[1] to d[N]. Each buffer BF[n] (for n=1 to N) is coupled between the bit d[n] and the capacitor Ca[n] for selectively providing charges to the capacitor Ca[n] in response to the bit b[n]. For example, the buffer BF[n] can be arranged to charge the capacitor Ca[n] with a fixed amount of charges if the bit b[n] equals a first logic value, and to discharge the capacitor Ca[n] if the bit b[n] equals a second logic value other than the first logic value. Each capacitor Ca[n] is coupled between the buffer BF[n] and the node n1i via the node nv; as the buffer BF[n] selectively provides charges in response to the bit d[n], the capacitor Ca[n] can therefore selectively changing charges of the node n11. With overall charges contributed by the capacitors Ca[1] to Ca[N], the analog voltage signal VB is built and provided. For example, to convert a greater digitized signal value streamed in the signal DB, more of the bits d[1] to d[N] are decoded to the first logic value by the code block 19A, hence more of the buffers BF[1] to BF[N] are arranged to provide charges to accumulate a higher signal VB.

Synthesizing the voltage signal VB by charges is possible owing to high impedance at the nodes nv and n11, since little current is needed to establish the signal VB. That is, by allowing use of low-power digital-to-analog conversion, arrangement of the mixer block 14 benefits further power saving. In addition, each buffer BF[n] of the converter 18A can be implemented by an inverter which only consumes minor transient dynamic power rather than greater steady DC power which impacts power-saving.

Figure 3:
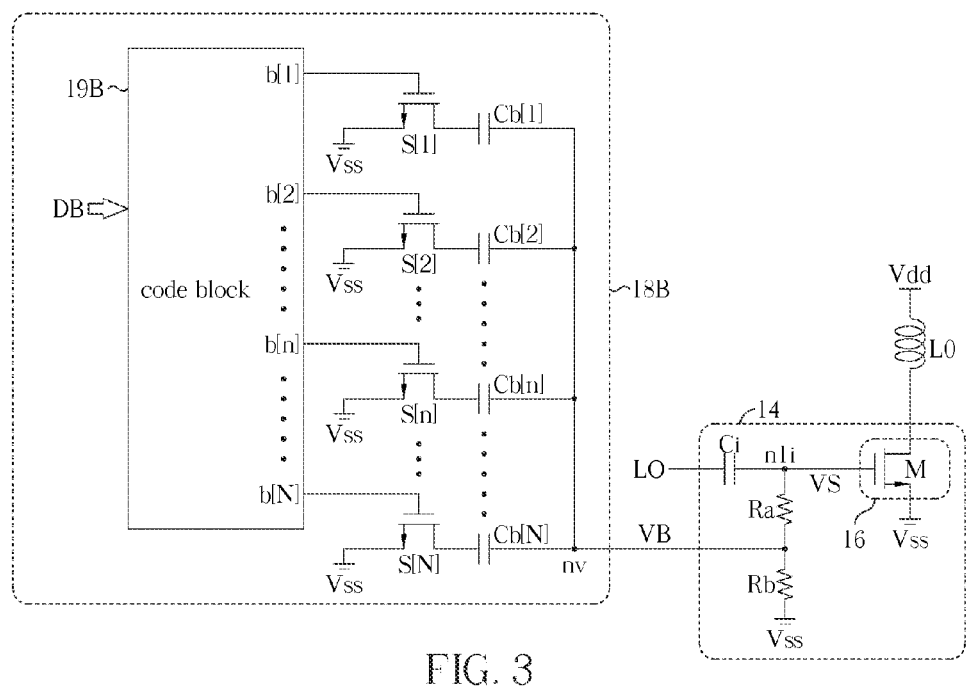

Please refer to FIG. 3 illustrating a converter 18B according to an embodiment of the invention. Similar to the converter 18A in FIG. 2, the converter 18B, e.g., a DAC, shown in FIG. 3 can cooperate with the mixer block 14 of the invention; for example, the mixer block 14 can be the mixer block 14p or 14m shown in FIG. 1, and the converter 18B can be adopted to implement the converters 18p and 18m. The converter 18B converts a digital input DB (e.g., the signal DBp or DBm) to an analog signal VB (e.g., the signal VBp or VBm) which is inputted to the mixer block 14 via a node nv.

The converter 18B includes a code block 19B and a switched capacitor array formed by a plurality of switches S[1] to S[N] and a plurality of capacitors Cb[1] to Cb[N]. The code block 19B receives the digital input DB and provides a plurality control bits b[1] to b[N] in response. For example, the code block 19B is arranged to decode each digitized signal value streamed in the digital input DB to an associated thermometer code, and binary bits of the thermometer code are respectively provided as the bits b[1] to b[N]. Each switch S[n] (for n=1 to N) can be implemented by a transistor which has a gate, a source and a drain respectively coupled to the bit b[n], the supply voltage Vss and a terminal of the capacitor Cb[n], with the other terminal of the capacitor Cb[n] coupled to the node nv. The switch S[n] is arranged to selectively conduct the capacitor Cb[n] to the supply voltage Vss in response to the bit b[n]. When the bit b[n] equals a first logic value which turns on the transistor of the switch S[n], the switch S[n] conducts a terminal of the capacitor Cb[n] to the supply voltage Vss, such that the capacitor Cb[n] can share charges of the node n1$i$. If the bit b[n] equals another second logic value which turns off the transistor of the switch S[n], the switch S[n] terminates conduction between the capacitor Cb[n] and the supply voltage Vss, and thus the capacitor Cb[n] does not join to share charges of the node n1$i$. Accordingly, each capacitor Cb[n] can selectively change charges of the node n1$i$ in response to the bit b[n].

Equivalently, the converter 18B is a switched capacitor voltage divider. By operations of the switches S[1] to S[N] and the capacitors Cb[1] to Cb[N], the signal VB is established in response to the bits b[1] to b[N], as the bits b[1] to b[N] control how many of the capacitors Cb[1] to Cb[n] are sharing charges of the node n1$i$. For example, to convert a greater digitized signal value streamed in the signal DB, fewer of the bits d[1] to d[N] are decoded to the first logic value by the code block 19B, hence fewer of the capacitors Cb[1] to Cb[N] are arranged to share charges of the node n1$i$, and a higher signal VB is thus maintained and presented at the node n1$i$.

Because the mixer block 14 can provide high impedance at the node nv (as well as the node n1$i$) for the low-frequency signal VB by the gate of the transistor M and the resistor Rb of greater resistance, and charges of the node n1$i$ can be provided by the signal LO and maintained by the capacitor Ci, the converter 18B does not need high driving strength to establish the signal VB (and the signal VS). Accordingly, the converter 18B can be implemented by a switched capacitor array of passive nature to further reduce power consumption. The resistor Ra also functions as a low-pass filter to suppress AC coupling from the node n1$i$ to the node nv, so the signal VB is kept from oscillating interference of the node n1$i$.

Figure 4:
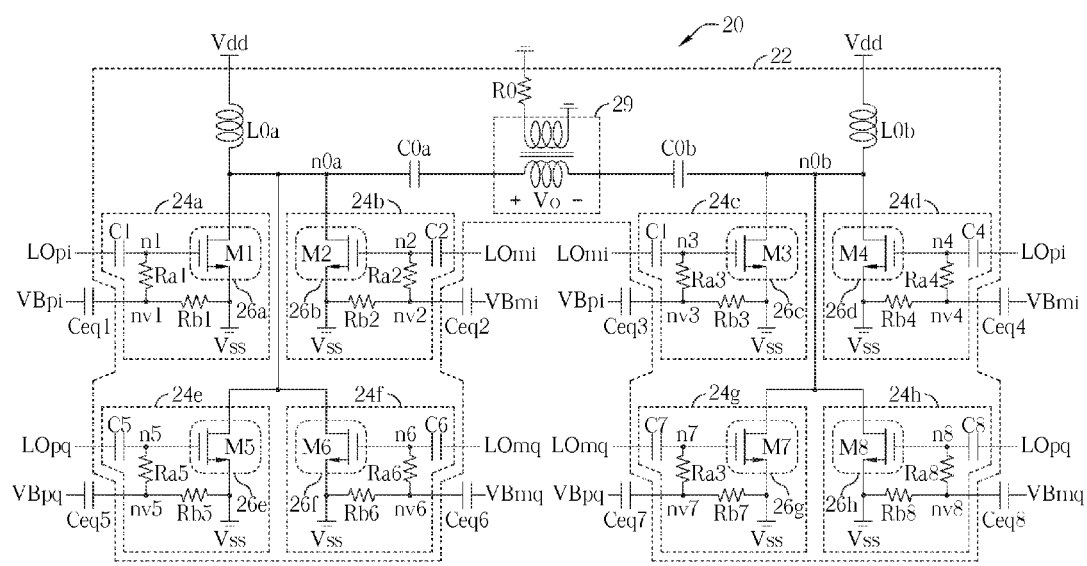
FIG. 4 to FIG. 6 respectively illustrate signal mixing circuits according embodiments of the invention.

Please refer to FIG. 4 illustrating a signal mixing circuit 20 according to an embodiment of the invention. The signal mixing circuit 20 includes a mixer module 22. The mixer module 22 operates between supply voltages Vdd and Vss, and includes mixer blocks 24$a$ to 24$h$, two inductors L0$a$ and L0$b$ as two loads, capacitors C0$a$ and C0$b$, as well as a balun 29. The mixer module 22 is arranged to receive signals VBpi, VBmi, VBpq and VBmq as input signals (e.g., base-band signals), receive signals LOpi, LOmi, LOpq and LOmq as oscillation signals (e.g., LO signals), and accordingly provide a mixed signal Vo between nodes n0$a$ and n0$b$. The inductor L0$a$ is coupled between the node n0$a$ and the supply voltage Vdd, and the inductor L1$a$ is coupled between the node n0$b$ and the supply voltage Vdd. The balun 29 is coupled between the nodes n0$a$ and n0$b$ via the capacitors C0$a$ and C0$b$.

The mixer blocks 24$a$ to 24$h$ are respectively coupled to the signals LOpi, LOmi, LOmi, LOpi, LOpq, LOmq, LOmq and LOpq at nodes n1 to n8 via capacitors C1 to C8, also respectively coupled to the signals VBpi, VBmi, VBpi, VBmi, VBpq, VBmq, VBpq and VBmq at nodes nv1 to nv8 via capacitors Ceq1 to Ceq8, such that the signals LOpi, LOmi, LOmi, LOpi, LOpq, LOmq, LOmq and LOpq can be respectively summed with the signals VBpi, VBmi, VBpi, VBmi, VBpq, VBmq, VBpq and VBmq at the nodes n1 to n8. The capacitors Ceq1 to Ceq8 are equivalent output capacitors of associated DACs (not shown); e.g., each of the capacitors Ceq1 to Ceq8 can represent capacitance contributed by the capacitors Ca[1] to Ca[N] (FIG. 2) or the capacitors Cb[1] to Cb[N] (FIG. 3) of an associated DAC.

In the mixer module 22, each mixer block 24$x$ (for x=a to h) also includes a resistor Ra# (#=1 to 8 respectively for x=a to h) coupled between nodes n# and nv#, a resistor Rb# coupled between the node nv# and the supply voltage Vss, and a circuit unit 26$x$ which receives signal of the node n# as a sum signal and accordingly alternates between a first state and a second state. During the first state, the circuit unit 26$x$ is arranged to provide driving contribution (e.g., a current) to the signal Vo in response to the sum signal, and to stop providing driving contribution during the second state. While the circuit units 26$a$, 26$b$, 26$e$ and 26$f$ are coupled to the node n0$a$ to provide pulling currents for the signal Vo, the circuit units 26$c$, 26$d$, 26$g$ and 26$h$ are coupled to the node n0$b$ to provide pushing currents for the signal Vo, so the signal Vo is differentially established across the balun 29 to be transferred to a single-ended signal across a resistor R0, e.g., a 50-ohm equivalent resistor of an antenna. Each circuit unit 26$x$ can be implemented by a transistor M# (e.g., an n-channel MOS transistor) which functions as a trans-conductance cell of a common-source power amplifier. The transistors M1 to M8 can be mutually matched, the capacitors C1 to C8 can be matched, the resistors Ra1 to Ra8 can be matched, and the resistors Rb1 to Rb8 can be matched.

The signals VBpi and VBmi can be differential; the signals LOpi and LOmi can be differential. Thus, the mixer blocks 24$a$ to 24$d$ combine to form a double-balanced mixer topology which mixes information of the signal VBpi by oscillating of the signal LOpi. Similarly, the signals VBpq and VBmq can be differential; the signals LOpq and LOmq can be differential. The mixer blocks 24$e$ to 24$h$ therefore form anther double-balanced mixer topology which mixes information of the signal VBpq by oscillating of the signal LOpq. In addition, the signals LOpi and LOpq can differ in phase by 90 degrees, so the signal LOmi and LOmq are also out of phase by 90 degrees. That is, the signals VBpi, VBmi, VBpq and VBmq can respectively be referred to as a positive in-phase input signal, a negative in-phase input signal, a positive quadrature-phase input signal and a negative quadrature-phase input signal, as well as the signals LOpi, LOmi, LOpq and LOmq can respectively be referred to as a positive in-phase oscillation signal, a negative in-phase oscillation signal, a positive quadrature-phase oscillation signal and a negative quadrature-phase oscillation signal. Accordingly, different information respectively embedded in the signals VBpi and VBpq can be respectively modulated as an in-phase signal and a quadrature-phase signal, and be combined into a same signal Vo by the mixer module 20 which integrates the mixer blocks 24$a$ to 24$d$ and 24$e$ to 24$h$.

Figure 5:
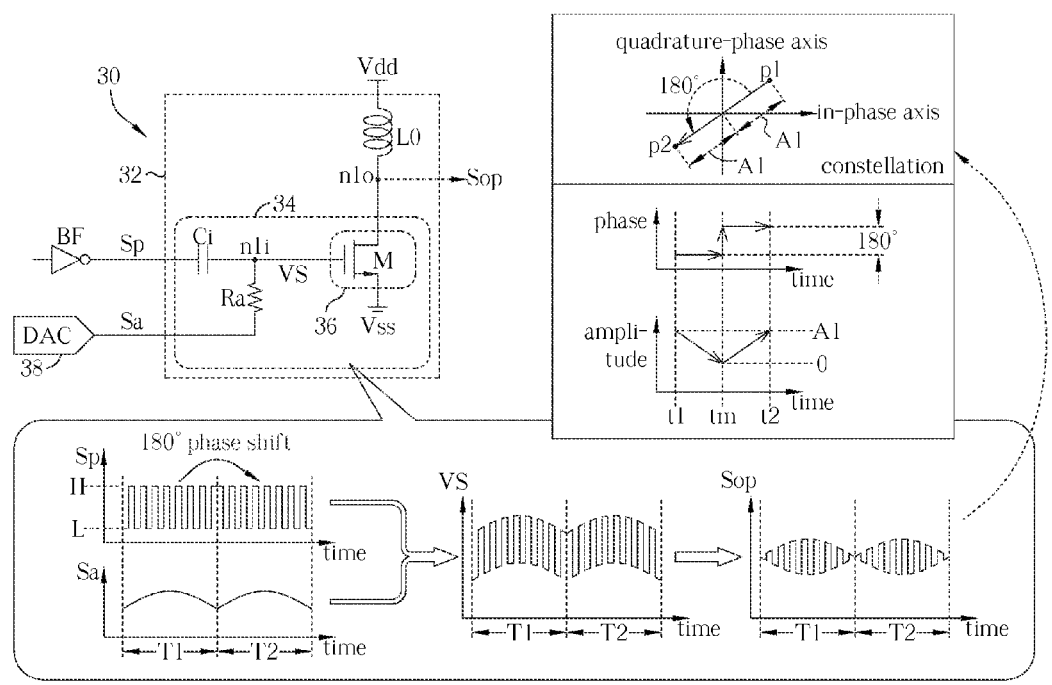

Please refer to FIG. 5 illustrating a signal mixing circuit 30 according to an embodiment of the invention. The signal mixing circuit 30 includes a converter 38 (e.g., a DAC), a buffer BF (e.g., an inverter) and a mixer module 32. The mixer module 32 operates between supply voltages Vdd and Vss, and includes an inductor L0 as a passive load, and a mixer block 34. The mixer block 34 includes a capacitor Ci, a resistor Ra and a circuit unit 36, which can be implemented by a transistor M (e.g., an n-channel MOS transistor) having a gate, a drain and a source respectively coupled to a node n1$i$, a node n1$o$ and the supply voltage Vss. The inductor L0 is coupled between the node n10 and the supply voltage Vdd. The capacitor Ci is coupled between the node n1$i$ and the buffer BF. The resistor Ra is coupled between the node n1$i$ and the converter 38.

In the signal mixing circuit 30, the buffer BF drives a high-frequency signal Sp, which is sent to the node n1$i$ via the capacitor Ci by AC coupling. The converter 38 provides a relatively low-frequency analog signal Sa which is sent to the node n1$i$ via the resistor Ra of low-pass. The signals Sa can therefore ride on the signal Sp at the node n1$i$ to form a signal VS. The circuit unit 36 receives the signals VS and alternates between conducting and not conducting according to whether the signal VS is greater than a cut-off level (not shown). When the circuit unit 36 conducts, it provides a driving contribution to the inductor L0 in response to the signal VS, thus the voltage signal Sop can be built on the inductor L0 and outputted at the node n10 as a mixed signal.

In addition to frequency translation (e.g., up-conversion), the signal mixing circuit of the invention can be utilized to implement an AM-PM combined power amplifier. The example shown in FIG. 5 demonstrates such application. The signal Sp oscillating at a fixed frequency can be used to carry information by phase. As shown in FIG. 5, during an interval T1, the signal Sp embeds a first section of phase information by maintaining a first phase; during a following interval T2, the signal Sp transits to a second phase to carry a second section of phase information. For example, the second phase can be 180 degrees different with the first phase to represent that the second section of phase information is different from the first section. On the other hand, the signal Sa can be used to carry information by varying amplitude. By mixing the signals Sp and Sa into the signal Sop, the mixer block 34 impresses information of the signals Sp and Sa into phase and amplitude of the signal Sop. That is, with the signals Sp and Sa respectively arranged to carry PM information and AM information, the mixed signal Sop is an AM-PM-merged signal, and the mixer module 32 serves as a polar transmitter.

The constellation of the signal Sop is also shown in FIG. 5. From time points t1, tm to t2, if phase of the signal Sp experiences a 180-degree transition and amplitude of the signal Sa gradually varies through a value A1, zero and back to the value A1, the signal Sop will leave a trail from a point p1 to a point p2 at the constellation.

Figure 6:
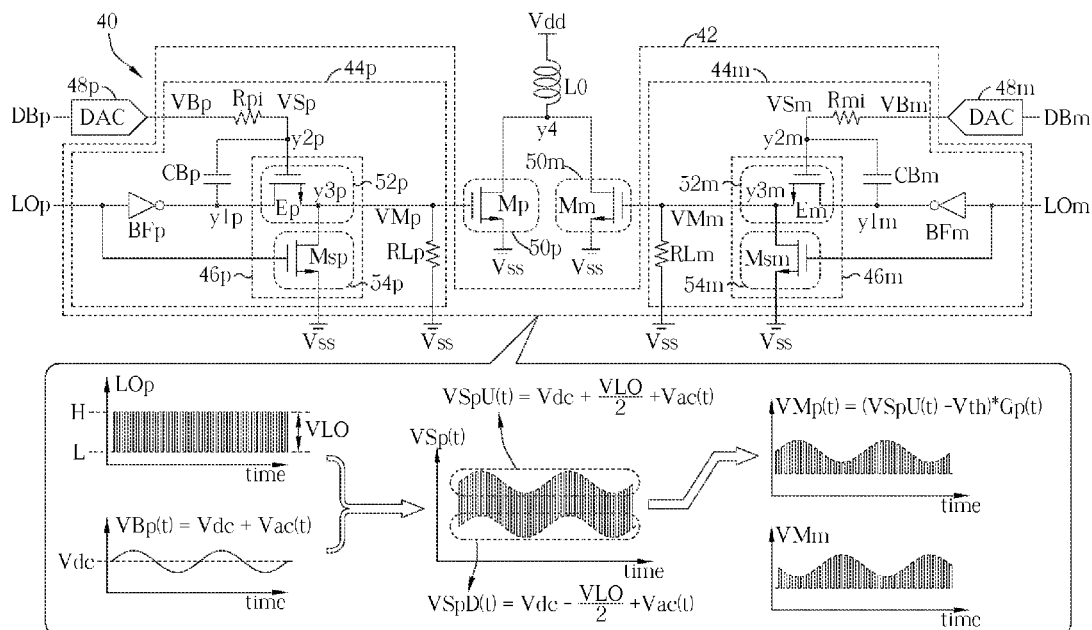

Please refer to FIG. 6 illustrating a signal mixing circuit 40 according to an embodiment of the invention. The signal mixing circuit 40 operates between supply voltages Vdd and Vss, and includes converters (e.g., DACs) 48$p$ and 48$m$, an inductor L0 as a load, trans-conductance cells 50$p$ and 50$m$, and a mixer module 42. The mixer module 42 includes mixer blocks 44$p$ and 44$m$. Functional structures of the mixer blocks 44$p$ and 44$m$ are the same. The mixer block 44$p$ includes resistors Rpi and RLp, a capacitor CBp, a buffer BFp (e.g., an inverter), and a circuit unit 46$p$. The circuit unit 46$p$ includes a follower 52$p$ (e.g., a source follower) and a switch 54$p$ as a mixing switch. Similarly, the mixer block 44$m$ includes resistors Rmi and RLm, a capacitor CBm, a buffer BFm, and a circuit unit 46$m$ which has a follower 52$m$ and a switch 54$m$.

By digital-to-analog conversion, the converters 48$p$ and 48$m$ respectively provides signals VBp and VBm in response to signals DBp and DBm (e.g., two base-band digital inputs). The mixer module 42 receives the signals VBp and VBm as input signals, also receives signals LOp and LOm, e.g., two differential oscillation signals alternating between levels H and L; in response, the mixer module 42 provides signals VMp and VMm as mixed signals. The inductor LO and the trans-conductance cells 50$p$ and 50$m$ form a differential power amplifier which amplifies a difference between the signals VMp and VMm.

In the mixer block 44$p$, the signal VBp is coupled to a node y2$p$ via the resistor Rpi. Via a node y1$p$, the buffer BFp drives the follower 52$p$ in response to inversion of the signal LOp. Because inversion of the signal LOp is also coupled to the node y2$p$ via the capacitor CBp, it rides on the signal VBp with an additional level VLO/2 bootstrapped by the capacitor CBp. Referring to waveforms shown in FIG. 6, the signal LOp has a swing equal to a level VLO; while the capacitor CBp can accumulate a DC component of the signal LOp, it maintains charges to support a voltage difference, which equals the level VLO/2, between the nodes y2$p$ and y1$p$. The signals LOp and VBp therefore sum with the level VLO/2 at the node y2$p$, such that a signal VSp at the node y2$p$ will oscillate at frequency of the signal LOp with swings confined between an upper envelope and a bottom envelope respectively represented by signals VSpU(t) and VSpD(t). By expressing the signal VBp as a sum of a DC level Vdc and an AC signal Vac(t), the signals VSpU(t) and VSpU(t) can be expressed by VSpU(t)=Vdc+VLO/2+Vac(t) and VSpD(t)=Vdc−VLO/2+Vac(t), as shown in FIG. 6.

The follower 52$p$ has a follower-input terminal, a bias terminal and a follower-output terminal respectively coupled to the signal VSp, (inversion of) the signal LOp and the switch 54$p$ at the nodes y2$p$, y1$p$ and y3$p$. The follower 52$p$ can be implemented by a transistor Ep (e.g., an n-channel MOS transistor) which has a gate, a drain and a source respectively coupled to the nodes y2$p$, y1$p$ and y3$p$. Thus, the follower 52$p$ functions to let signal of the follower-output terminal track signal of the follower-input terminal, with the two signals differing by an offset level (e.g., a voltage level in association with threshold voltage of the transistor Ep).

The switch 54$p$ is coupled between the node y3$p$ and a predetermined DC level of the supply voltage Vss, and is arranged to conduct the node y3$p$ to the supply voltage Vss when the signal LOp is at the level H, and to stop conduction when the signal LOp is at the level L. The switch 54$p$ can be implemented by a transistor Msp (e.g., an n-channel MOS transistor) which has a gate, a drain and a source respectively coupled to the signal LOp, the node y3$p$ and the supply voltage Vss.

By cooperation of the follower 52$p$ and the switch 54$p$, the signal VMp can be built across the resistor RLp which coupled between the node y3$p$ and the supply voltage Vss. When the signal LOp is at the level H, the signal VSp swings to the bottom envelope (the signal VSpD(t)), but the node y3$p$ is conducted to the supply voltage Vss by the switch 54$p$, so the signal VMp is kept at the level of the supply voltage Vss. When the signal LOp is at the level L, the transistor MSp of the switch 54$p$ turns off, thus voltage at the node y3$p$ is left to be controlled by the follower 52$p$; since the signal VSp swings to the upper envelope (the signal VSpU(t)) when the signal LOp is at the level L, the signal VMp follows the signal VSpU(t) with an offset level Vth subtracted. Equivalently, the signal VMp can be expressed by VMp(t)=(VSpU(t)−Vth)*Gp(t)={(Vdc+VLO/2−Vth)+Vac(t)}*Gp(t), where the signal Gp(t) is a gating signal which equals 1 when the signal LOp is at the level L, and equals 0 when the signal LOp is at the level H. Note that the level VLO/2 provided by the capacitor CBp can be used to compensate the opposite offset level Vth induced by the follower 52$p$.

Similar to the mixer block 44p, the mixer block 44m sums the signal VBm and inversion of the signal the signal LOm with an additional DC level VLO/2, provided by the capacitor CBm, at a node y2m, and a resultant signal is inputted to the follower 52m implemented by a transistor Em (e.g., a transistor matched with the transistor Ep). When the signal LOm is at the level H, the switch 54m implemented by a transistor Msm (e.g., a transistor matched with the transistor Msp) conducts a node y3m to the supply voltage Vss, thus the signal VMm vanishes to the level of the supply voltage Vss. When the signal LOm is at the level L, the switch 54m does not conduct, and the buffer BFm in turn drives the signal VMm via the follower 52m.

In the signal mixing circuit 40, the signals LOp and LOm can be differential. The signals VBm and VBp can also be differential, e.g., the signal VBm can be expressed by VBm(t)=Vdc−Vac(t); hence, the signal VMm can be expressed by VMm(t)=(Vdc+VLO/2−Vth−Vac(t))*Gm(t), where the signal Gm(t) is another gating signal expressed by Gm(t)=1−Gp(t). Thus, the trans-conductance cells 50p and 50m, implemented by matched transistors Mp and Mm, can jointly drive a node y4 in response to the signals VMp and VMm, such that a signal at the node y4 can reflect effect of mixing signals Vac(t) and LOp(t).

Because the converters 48p and 48m interface high impedance provided by gates of the transistors Ep and Em, they do not need high driving strength to support the signals VSp and VSm, and hence they can be implemented by the low-power converter 18A or 18B shown in FIG. 2 and FIG. 3. The signal mixing circuit 40 can also be expanded to implement double-balanced signal mixing and/or I-Q (in-phase and quadrature-phase) signal mixing, similar to the signal mixing circuit 20 shown in FIG. 4.

To sum up, the invention implements signal mixing by directly summing input signal and oscillation signal at a node and truncating the resultant sum signal. Signal mixing can therefore benefit from simplified structure, less DC current dissipation, reduced power consumption, and compatibility to low-power DAC.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A signal mixing circuit comprising:
    a mixer module for receiving a first number of input signals and a second number of oscillation signals, and providing a mixed signal in response; the mixer module comprising a third number of mixer blocks, each of the mixer blocks coupled to an associated one of the first number of input signals and an associated one of the second number of oscillation signals, and each of the mixer blocks comprising:
    a summing node for providing a sum signal by summing the associated input signal and the associated oscillation signal; and
    a circuit unit for alternating between a first state and a second state in response to the associated oscillation signal, wherein the circuit unit is arranged to provide driving contribution to the mixed signal in response to the sum signal during the first state, and to stop providing driving contribution during the second state.

2. The signal mixing circuit of claim 1, wherein the summing node sums the associated oscillation signal and the associated input signal by arranging the associated input signal to ride on the associated oscillation signal.

3. The signal mixing circuit of claim 1, wherein each the mixer block further comprises:
    a capacitor coupled between the associated oscillation signal and the summing node for AC (alternating-current) coupling.

4. The signal mixing circuit of claim 1, wherein each the mixer block further comprises:
    a resistor coupled between the associated input signal and the summing node for suppressing AC coupling from the associated oscillation signal to the associated input signal.

5. The signal mixing circuit of claim 1, wherein the first number of input signals include a first input signal and a second input signal which are differential, the second number of oscillation signals include a first oscillation signal and a second oscillation signal which are differential, and the mixer module further comprises a load coupled to associated two of the third number of mixer blocks; one of the two associated mixer blocks is coupled to the first input signal and the first oscillation signal, and the other one of the two associated mixer blocks is coupled to the second input signal and the second oscillation signal.

6. The signal mixing circuit of claim 1, wherein the first number of input signals include a first input signal and a second input signal, the second number of oscillation signals include a first oscillation signal and a second oscillation signal which differ in phase by 90 degrees, and the mixer module further comprises a load coupled to associated two of the third number of mixer blocks; one of the two associated mixer blocks is coupled to the first input signal and the first oscillation signal, and the other one of the two associated mixer blocks is coupled to the second input signal and the second oscillation signal.

7. The signal mixing circuit of claim 1, wherein the first number of input signals include a first input signal, the second number of oscillation signals include a first oscillation signal and a second oscillation signal which are differential, and the mixer module further comprises two loads respectively coupled to associated two of the third number of mixer blocks; one of the two associated mixer blocks is coupled to the first input signal and the first oscillation signal, and the other one of the two associated mixer blocks is coupled to the first input signal and the second oscillation signal.

8. The signal mixing circuit of claim 1, wherein the mixer module further comprises a fourth number of loads; each of the third number of mixer blocks is further coupled to an associated one of the fourth number of loads, and the circuit unit of each the mixer block comprises:
    a transistor comprising a gate and a drain respectively coupled to the summing node and the associated load of each the mixer block.

9. The signal mixing circuit of claim 1 further comprising:
    a fifth number of converters; each of the fifth number of converters arranged to provide an associated one of the input signals to an associated one of the mixer blocks in response to an associated digital input, and comprising:
    a plurality of converter capacitors commonly coupled to the summing node of the associated mixer block for selectively changing charges of the summing node in response to the associated digital input.

10. The signal mixing circuit of claim 9, wherein each of the converters further comprises:

a plurality of converter switches, each of the converter switches selectively conducting one of the converter capacitors to a predetermined level for sharing charges of the summing node in response to the associated digital input.

11. The signal mixing circuit of claim 9, wherein each of the converters further comprises:
a plurality of converter buffers, each of the converter buffers arranged to selectively provide charges to one of the converter capacitors in response to the associated digital input.

12. The signal mixing circuit of claim 1, wherein each of the oscillation signals is arranged to carry a PM (phase-modulation) information, each of the input signals is arranged to carry an AM (amplitude-modulation) information, and the mixed signal is an AM-PM-merged signal.

13. The signal mixing circuit of claim 1, wherein the circuit unit is arranged to alternate between the first state and the second state in response to whether the sum signal is greater than a cut-off level.

14. The signal mixing circuit of claim 1, wherein the circuit unit comprises:
a follower comprising a bias terminal, a follower-input terminal and a follower-output terminal; the bias terminal and the follower-input terminal respectively coupled to the associated oscillation signal and the summing node; and
a mixing switch coupled between the follower-output terminal and a predetermined level for conducting the follower-output terminal to the predetermined level during the second state, and ceasing conduction during the first state.

15. A signal mixing circuit comprising:
a number of mixer blocker, each of the mixer blocks arranged to provide a mixed signal by mixing an input signals and an oscillation signals, and comprising:
a summing node for summing the input signal and the oscillation signal; and
a transistor comprising a gate coupled to the summing node and a drain for outputting the mixed signal;
wherein each of the mixer blocks further comprises a resistor coupled between the input signal and the summing node.

16. A signal mixing circuit comprising:
a number of mixer blocks, each of the mixer blocks arranged to provide a mixed signal by mixing an input signals and an oscillation signals, and comprising:
a summing node for summing the input signal and the oscillation signal; and
a transistor comprising a gate coupled to the summing node and a drain for outputting the mixed signal;
wherein each of the mixer blocks further comprises a capacitor coupled between the oscillation signal and the summing node.

* * * * *